United States Patent
Choi et al.

(10) Patent No.: US 7,539,920 B2
(45) Date of Patent: May 26, 2009

(54) LDPC DECODING APPARATUS AND METHOD WITH LOW COMPUTATIONAL COMPLEXITY ALGORITHM

(75) Inventors: Eun-A Choi, Daejon (KR); Nae-Soo Kim, Daejon (KR); Deock-Gil Oh, Daejon (KR); Ji-Won Jung, Busan (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 609 days.

(21) Appl. No.: 11/265,451

(22) Filed: Nov. 2, 2005

(65) Prior Publication Data

US 2006/0136799 A1 Jun. 22, 2006

(30) Foreign Application Priority Data

Dec. 16, 2004 (KR) ...................... 10-2004-0106779

(51) Int. Cl.
*H03M 13/00* (2006.01)

(52) U.S. Cl. .................... 714/755; 714/786; 714/797

(58) Field of Classification Search ................ 714/755, 714/786, 794–795; 375/262, 265, 341
See application file for complete search history.

(56) References Cited

U.S. PATENT DOCUMENTS

| | | | |
|---|---|---|---|
| 6,633,856 B2 | 10/2003 | Richardson et al. | |
| 6,829,308 B2 * | 12/2004 | Eroz et al. | ................ 375/271 |
| 2004/0005865 A1 | 1/2004 | Eroz et al. | |
| 2004/0019845 A1 | 1/2004 | Eroz et al. | |
| 2004/0153960 A1 | 8/2004 | Eroz et al. | |

FOREIGN PATENT DOCUMENTS

| | | |
|---|---|---|
| JP | 2002-033670 | 1/2002 |
| JP | 2004-186940 | 7/2004 |
| KR | 1020030016720 | 3/2003 |
| KR | 1020030095144 | 12/2003 |
| KR | 1020040010116 | 1/2004 |
| KR | 1020050100152 | 10/2005 |

* cited by examiner

*Primary Examiner*—Guy J Lamarre
(74) *Attorney, Agent, or Firm*—Ladas & Parry LLP

(57) ABSTRACT

Provided are an LDPC decoding apparatus and method using a sequential decoding algorithm having a partial group, capable of reducing the number of an iterative decoding by more than half without degrading the performance and increasing an amount of computation. The LDPC decoding method includes the steps of: receiving a prior probability information (channel values) based on information on channel values associated with distance between symbol signals in constellation related to the received noise and LDPC encoded data, and initializing bit nodes; dividing check nodes into partial groups before updating check node information based on the prior probability information, and performing a decoding by applying a sequential decoding algorithm; determining whether a parity check equations are satisfied; and outputting decoded messages obtained when satisfying the parity check equation or after terminating an iterative processor by a termination algorithm.

3 Claims, 6 Drawing Sheets

FIG. 2

$$H = \begin{bmatrix} \overset{n_1}{1} & \overset{n_2}{0} & \overset{n_3}{0} & \overset{n_4}{1} & \overset{n_5}{1} & \overset{n_6}{0} & \overset{n_7}{0} & \overset{n_8}{1} \\ 0 & 1 & 1 & 0 & 1 & 0 & 1 & 0 \\ 1 & 0 & 1 & 0 & 0 & 1 & 0 & 1 \\ 0 & 1 & 0 & 1 & 0 & 1 & 1 & 0 \end{bmatrix} \begin{matrix} m_1 \\ m_2 \\ m_3 \\ m_4 \end{matrix}$$

LDPC DECODING APPARATUS AND METHOD WITH LOW COMPUTATIONAL COMPLEXITY ALGORITHM

CROSS-REFERENCE TO RELATED APPLICATIONS

The present application claims priority to Korean patent application number 10-2004-0106779 filed on Dec. 16, 2004, which is incorporated herein by reference in its entirety.

FIELD OF THE INVENTION

The present invention relates to an LDPC decoding apparatus and method using a sequential decoding algorithm having a partial group of a low computational complexity; and, more particularly, to an LDPC decoding apparatus and method using a sequential decoding algorithm having a partial group, capable of reducing the repetition number of a decoding by more than half without degrading the performance and increasing an amount of computation.

DESCRIPTION OF RELATED ART

A low density parity check (hereinafter, referred to as an LDPC) decoding widely uses a sequential decoding method.

An LDPC code has the best performance among the known channel codes and is recently used for an actual implementation. A turbo code has been widely used because of its good performance. However, since the turbo code has a high complexity, it has difficulty in a high-speed processing. Unlike the turbo code, the LDPC code can be easily decoded in parallel and thus a decoding speed can be increased. However, since a channel code for a broadcasting modem design has a long frame length to be processed, an actual implementation is difficult only using the general advantages of the LDPC code. Also, because of its vast structure, a research on a high-speed structure of a decoding process is essential in designing a channel codec that supports various code rates.

Accordingly, there is a demand for a decoding algorithm that can satisfy the performance required in a modem design using the LDPC code and can also reduce the repetition number for high-speed data processing without increasing the computational complexity.

SUMMARY OF THE INVENTION

It is, therefore, an object of the present invention to provide an LDPC decoding apparatus and method using a sequential decoding algorithm having a partial group of a low computational complexity, capable of reducing the repetition number of a decoding by more than half without degrading the performance and increasing an amount of computation.

In accordance with an aspect of the present invention, there is provided a Low Density Parity Check (LDPC) decoding method including the steps of: receiving a prior probability information (channel values) based on information on channel values associated with distance between symbol signals in constellation related to the received noise and LDPC encoded data, and initializing bit nodes; dividing check nodes into partial groups before updating check node information based on the prior probability information, and performing a decoding by applying a sequential decoding algorithm; determining whether a parity check equations are satisfied; and outputting decoded messages obtained when satisfying the parity check equation or after terminating an iterative processor by a termination algorithm.

In accordance with another aspect of the present invention, there is provided an LDPC decoding apparatus using a sequential decoding algorithm having a partial group of a low computational complexity, the LDPC decoding apparatus including: an allocating block for allocating channel value to an output branch from a bit node to a check node; a dividing block for dividing check nodes to be calculated for updating bit node information during receiving signals into partial groups; a calculating block for performing a calculation for updating bit node information in a sequential format based on the divided group unit; determining block for determining whether to continue decoding or terminate a process by using a parity check equation; and voting block for performing a soft majority vote by using the updated bit nodes.

BRIEF DESCRIPTION OF THE DRAWINGS

The above and other objects and features of the present invention will become apparent from the following description of the preferred embodiments given in conjunction with the accompanying drawings, in which:

FIG. 2 is an exemplary diagram of a parity check matrix used in an LDPC encoding/decoding;

DETAILED DESCRIPTION OF THE INVENTION

Other objects and aspects of the invention will become apparent from the following description of the embodiments with reference to the accompanying drawings, which is set forth hereinafter.

Figure 1:
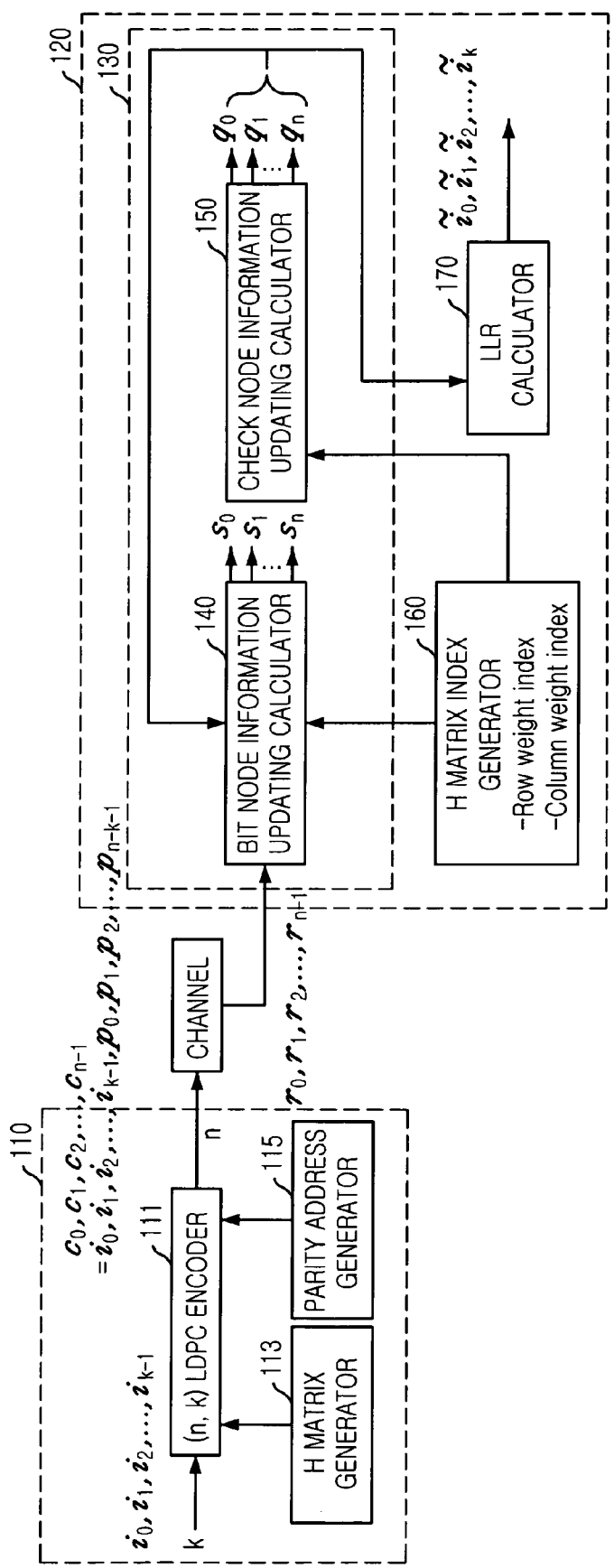
FIG. 1 is a conceptual block diagram of an LDPC encoding/decoding apparatus.

FIG. 1 is a conceptual diagram of an LDPC encoding/decoding apparatus. In FIG. 1, the LDPC encoding/decoding apparatus includes an LDPC encoding part 110 and an LDPC decoding part 120.

The LDPC encoding part 110 includes an H matrix generator 113, a parity address generator 115, and a (n, K) LDPC encoder 111.

The LDPC decoding part 120 includes a bit node information updating calculator 140 for updating bit node information, a check node information updating calculator 150 for updating check node information, an iterative loop executor 130 for iteratively updating the bit node information and the check node information and repeating the calculation until satisfying a parity check equation, and a log-likelihood ratio (LLR) calculator 170 for deciding whether to decode original data using values obtained after termination of the iterative loop. An H matrix index generator 160 generates an H matrix index used to updating the bit node information. Since the encoder and the decoder of FIG. 1 have a general LDPC structure, a detailed description thereof will be omitted for conciseness.

FIG. 2 is an exemplary diagram of a parity check matrix used for the LDPC encoding/decoding.

The LDPC code is a long linear block code having a parity check matrix. The matrix shown in FIG. 2 is a parity check matrix for an LDPC code having a block length (n) of 8 and a code rate of ½.

Figure 3A:
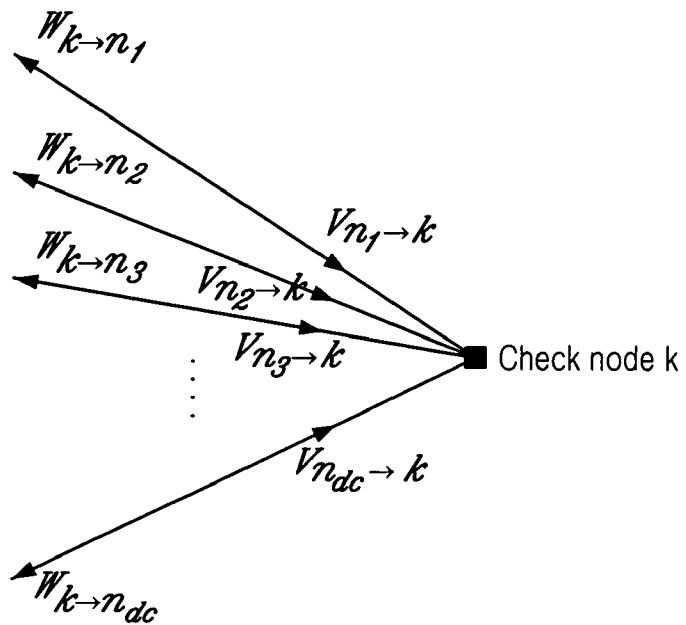
FIGS. 3A and 3B are conceptual diagrams of a message update algorithm at a bit node and a check node during a conventional LDPC decoding.
Figure 3B:
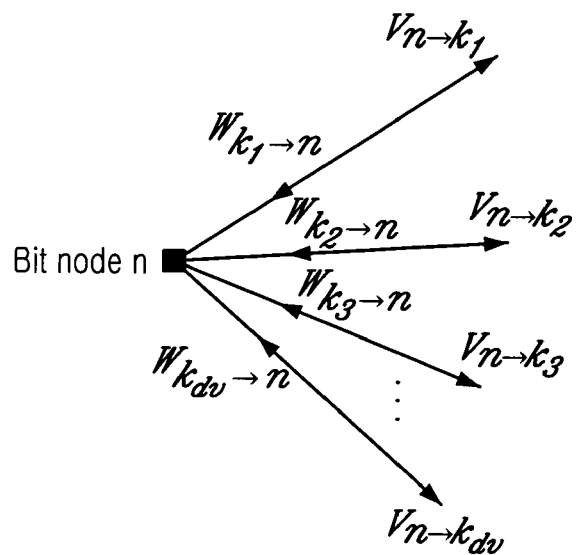

FIGS. 3A and 3B are conceptual diagrams of a message update algorithm at the bit node and the check node during a conventional LDPC decoding.

In more detail, FIG. 3A is a conceptual diagram illustrating a process of updating the calculation of the check node information using the bit node information, and FIG. 3B is a conceptual diagram illustrating a process of updating the calculation of the bit node information using the check node information. In FIG. 1, the bit node information updating calculator 140 performs the process of FIG. 3B and the check node information updating calculator 150 performs the process of FIG. 3A.

Although the decoding algorithm in a DVB-S2 is almost equal to the general LDPC decoding algorithm, there is a small difference in a method of producing an LUT and a method of calculating a check node probability. The decoding algorithm can be divided into an initializing process of calculating a channel estimation value in a reception bit, a check node update (CNU) process of calculating a check node probability, and a bit node update (BNU) process of calculating a bit probability.

The decoding algorithm proposed in the DVB-S2 can be summarized as follows.

Step 1: Initialization

When the channel is a Gaussian channel (AGWN) and an ISI memory less channel, a channel transmission probability can be expressed as $$P(r|x_n=b)=P(r_n=b|x_n=b)$$

where, $r_n$ is an element located at a specific position n of a reception vector r. When $x_n=0, 1$, if BPSK modulation for mapping with 1 and +1 is performed, $P(r_n=b|x_n=b)$ can be expressed using a Gaussian PDF as follows.

$$f_n^b = \frac{1}{\sqrt{2\pi}\sigma}\exp\left(-\frac{(r_n+(-1)^b)^2}{2\sigma^2}\right)$$

If the above equation is converted into a log-domain for implementation, the result is given as Equation 1 below.

$$u_n = -L_c \cdot r_n\left(L_c = \frac{2}{\sigma^2}\right),$$ Equation 1
$$n = (0, 1, K, N-1)$$

Step 2: Check Node Update (CNU)

FIG. 3A is an exemplary diagram illustrating the process of calculating the probability of bits that can be entered through one check node in the CNU of calculating the check node probability. Assuming that there is the $n_{dc}$ number of row weights, the probability of the bits entered through each check node is expressed as Equation 2 below.

$$w_{k \to n_i} = g(v_{n_1 \to k}, v_{n_2 \to k}, v_{n_{i-1} \to k}, v_{n_{i+1} \to k}, \ldots, v_{n_{dc} \to k})$$

$$g(a,b)=\text{sign}(a)\times\text{sign}(b)\times\{\min(|a|,|b|)\}+LUT_g(a,b)$$ Equation 2 where, $LUT_g(a,b)=\ln(1+e^{-|a+b|})-\ln(1+e^{-|a-b|})$

Accordingly, the CNU can be calculated only using one lookup table of $LUT(x)=\ln(1+e^{-x})$ Step 3: Bit Node Update (BNU)

After the bits connected to each check node are updated in the CNU, the probability of bit nodes corresponding to each row is calculated. The probability is give as Equation 3 below.

$$v_{n \to k_i} = u_n + \sum_{j \neq i} w_{k_j \to n}$$ Equation 3

Intuitively, using all related information regarding $w_{k \to n}$, this equation becomes a soft majority vote with respect to a value of the bit n.

Figure 4A:
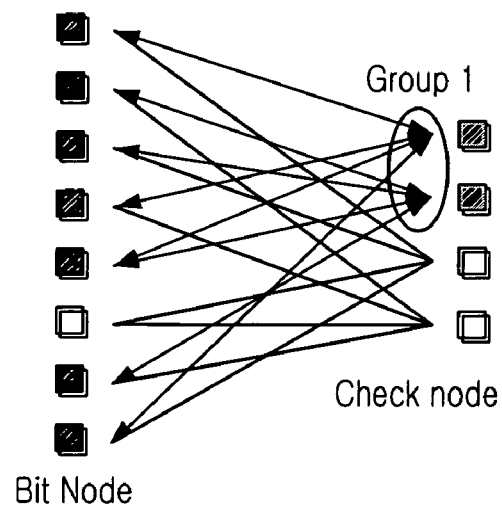
FIGS. 4A and 4B are conceptual diagrams of an LDPC decoding using a sequential decoding algorithm having a partial group of a low computational complexity in accordance with an embodiment of the present invention.
Figure 4B:
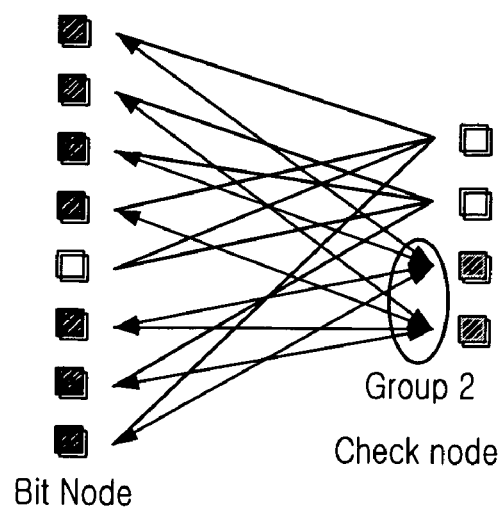

FIGS. 4A and 4B are conceptual diagrams of an LDPC decoding using a sequential decoding algorithm having a partial group in accordance with an embodiment of the present invention. The above-mentioned LDPC has an advantage in that a decoding speed is rapid because a parallel decoding is possible. However, if many bit nodes or check nodes are calculated in parallel, hardware size or power consumption will increase very greatly. Accordingly, the check nodes are divided into several sub-groups.

As shown in FIG. 1, the conventional LDPC decoder includes the calculator 150 for the CNU and the calculator 140 for the BNU. The CNU block is calculated in parallel. However, the use of the sequential decoding algorithm can reduce the amount of computation at the same performance. First, the check nodes are divided into p sub-groups. Each of the sub-groups has n check nodes. The case of p=1 is equal to the conventional decoding method in which there is no division of the check nodes into the sub-groups. A total number (M) of the check nodes at that time is n×p. Next, the check nodes of the first sub-group are updated. Then, the bit nodes are updated through the updated check nodes, and the check nodes of other sub-groups are updated through the updated bit nodes. When dividing the check nodes into the sub-groups, it is important to widely distribute the connection branches of the check nodes and the bit nodes.

In the serially connected structure, the decoding process is performed while the first decoder transmits extrinsic information to the first decoder after the first decoder performs the decoding. Likewise, the sequential decoding divides the check nodes into p decoding modules and performs a decoding, and then transmits it to a next decoding module. Since this is a transmission to a next sub-group after the result of the bit node update, the repetition number is required N/2 times (where N is the repetition number in the conventional method) as much as the conventional method at the same decoding time without degradation of the performance.

Figure 5:
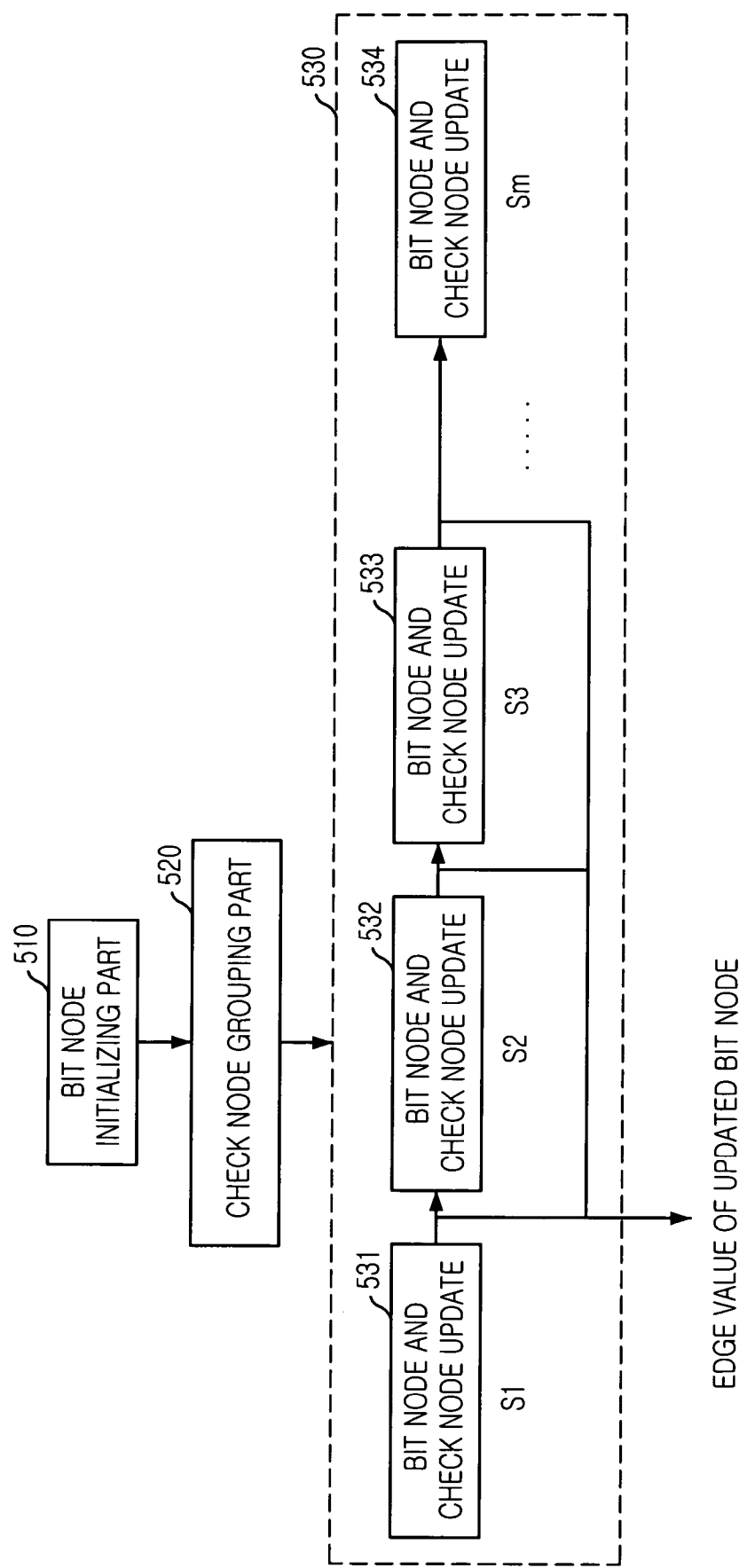
FIG. 5 is a functional block diagram of the LDPC decoding shown in FIGS. 4A and 4B.

FIG. 5 is a functional block diagram of the LDPC decoding using the sequential decoding algorithm having the partial groups in accordance with an embodiment of the present invention.

Referring to FIG. 5, the LDPC decoder receives a prior probability information, that is, channel values, based on information on channel values associated with distance between symbol signals in constellation related to the received noise and LDPC encoded data. Next, a bit node initializing part 510 initializes bit nodes according to the typical manner. A check node grouping part 520 divides the check node into partial groups (for example, m groups) before updating the check node information based on the prior probability information, that is, the channel value information. Then, by applying the sequential decoding algorithm, an iterative loop executing part 530 executes the LDPC decoding by performing an iterative calculation until satisfying the parity check equation. In this step, the iterative loop executing part 530 outputs the decoded messages obtained when satisfying the parity check equation or after terminating the iterative processor by the termination algorithm.

Figure 6:
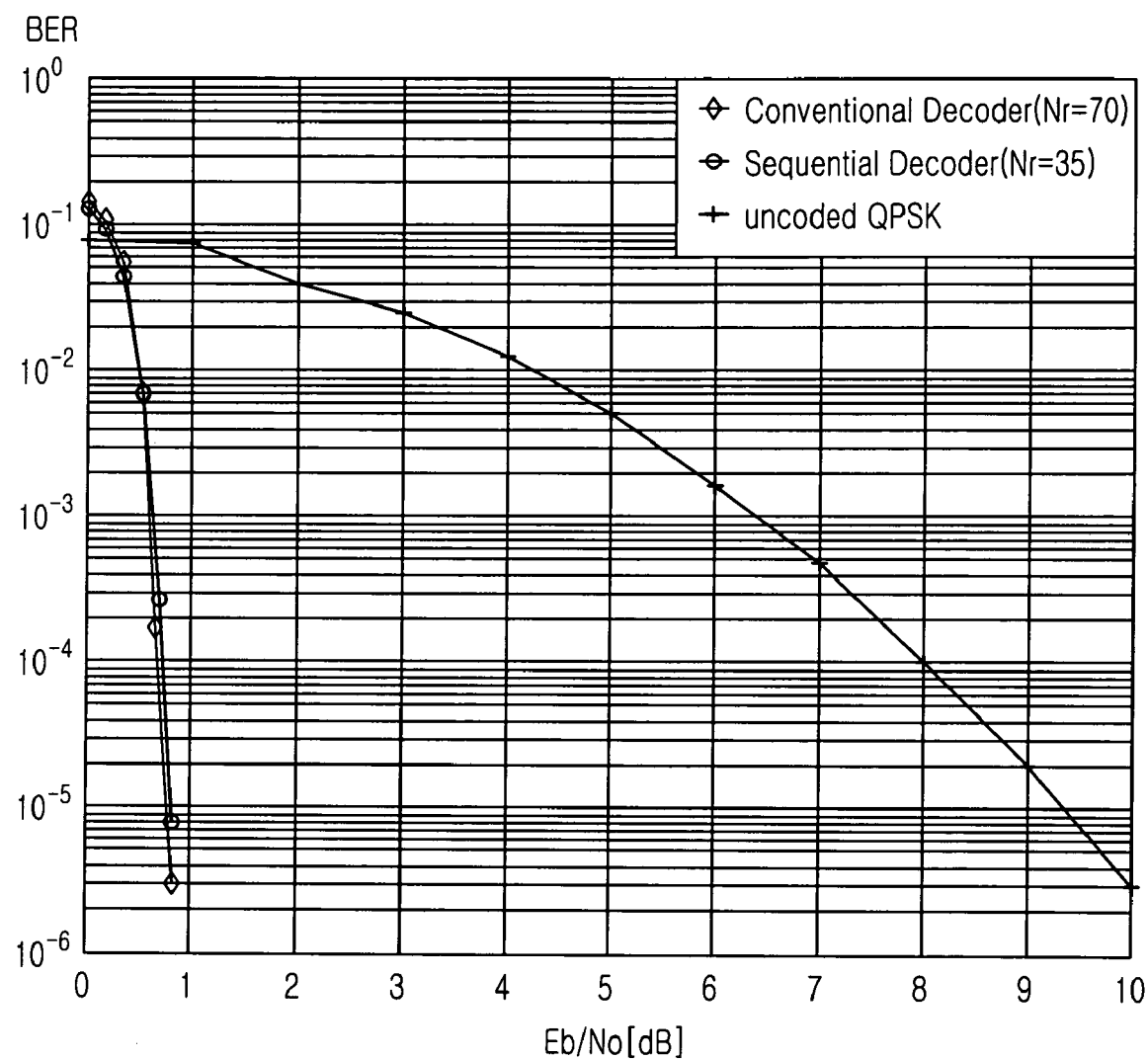
FIG. 6 is an exemplary graph of BERs obtained by a conventional LDPC decoding method and an inventive LDPC decoding method.

FIG. 6 is an exemplary graph of BERs obtained by the conventional LDPC decoding method and the inventive LDPC decoding method. As can be seen from FIG. 6, the repetition number necessary for the decoding is reduced by half under the same performance and the same power.

As described above, the LDPC decoding apparatus and method in accordance with the present invention can reduce the repetition number of the decoding by more than half without degrading the performance and increasing an amount of computation.

The method in accordance with the present invention can be stored in computer-readable recording media (CD-ROM, RAM, ROM, floppy disk, hard disk, magneto-optical disk).

The present application contains subject matter related to Korean patent application No. 2004-0106779, filed with the Korean Intellectual Property Office on Dec. 16, 2004, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A Low Density Parity Check (LDPC) decoding method comprising the steps of:
    receiving a prior probability information (channel values) based on information on channel values associated with distance between symbol signals in constellation related to the received noise and LDPC encoded data, and initializing bit nodes;
    dividing check nodes into partial groups before updating check node information based on the prior probability information, and performing a decoding by applying a sequential decoding algorithm;
    determining whether a parity check equations are satisfied; and
    outputting decoded messages obtained when satisfying the parity check equation or after terminating an iterative processor by a termination algorithm.

2. The LDPC decoding method as recited in claim 1, wherein when dividing the check nodes into the partial groups, connection branches of the check nodes and the bit nodes are widely distributed.

3. An LDPC decoding apparatus using a sequential decoding algorithm having a partial group of a low computational complexity, the LDPC decoding apparatus comprising:
    means for allocating channel value to an output branch from a bit node to a check node;
    means for diving check nodes to be calculated for updating bit node information during receiving signals into partial groups;
    means for performing a calculation for updating bit node information in a sequential format based on the divided group unit;
    means for continuing a decoding or terminating a processor by using a parity check equation; and
    means for performing a soft majority vote by using the updated bit nodes.

* * * * *